(12) United States Patent
Benwadih et al.

(10) Patent No.: US 9,935,282 B2
(45) Date of Patent: Apr. 3, 2018

(54) METHOD FOR PRODUCING AN ORGANIC CMOS CIRCUIT AND ORGANIC CMOS CIRCUIT PROTECTED AGAINST UV RADIATION

(71) Applicant: COMMISSARIAT A L'ENERGIE ATOMIQUE ET AUX ENERGIES ALTERNATIVES, Paris (FR)

(72) Inventors: Mohammed Benwadih, Champigny sur Marne (FR); Romain Coppard, Voiron (FR); Olivier Poncelet, Grenoble (FR)

(73) Assignee: Commissariat a l'Energie Atomique et aux Energies (FR)

(*) Notice: Subject to any disclaimer, the term of this patent is extended or adjusted under 35 U.S.C. 154(b) by 53 days.

(21) Appl. No.: 14/899,888

(22) PCT Filed: Jul. 31, 2014

(86) PCT No.: PCT/FR2014/051993
§ 371 (c)(1),
(2) Date: Dec. 18, 2015

(87) PCT Pub. No.: WO2015/019004
PCT Pub. Date: Feb. 12, 2015

(65) Prior Publication Data
US 2016/0141529 A1    May 19, 2016

(30) Foreign Application Priority Data
Aug. 8, 2013   (FR) ..................................... 13 57883

(51) Int. Cl.
*H01L 29/08*   (2006.01)
*H01L 51/05*   (2006.01)
(Continued)

(52) U.S. Cl.
CPC ........ *H01L 51/0537* (2013.01); *H01L 27/283* (2013.01); *H01L 51/0017* (2013.01);
(Continued)

(58) Field of Classification Search
None
See application file for complete search history.

(56) References Cited

U.S. PATENT DOCUMENTS

2008/0237595 A1* 10/2008 Park ................... H01L 29/7869
257/57
2010/0127241 A1   5/2010 Gruner et al.
(Continued)

FOREIGN PATENT DOCUMENTS

| FR | 2925359 A1 | 6/2009 |
| FR | 2925518 A1 | 6/2009 |
| FR | 2955115 A1 | 7/2011 |

OTHER PUBLICATIONS

Chang, et al., "Conjugated-Polymer-Based Lateral Heterostructures Defined by High-Resolution Photolithography", Advanced Functional Materials, vol. 20, Issue 17, Sep. 9, 2010, pp. 2825-2832.
(Continued)

*Primary Examiner* — Hung Vu
(74) *Attorney, Agent, or Firm* — Forge IP, PLLC

(57) ABSTRACT

An organic CMOS circuit including a substrate having an N-type organic transistor and a P-type organic transistor formed thereon, the transistors respectively including a layer of N-type semiconductor material and a layer of P-type semiconductor material. A surface of each of the semiconductor material layers, opposite to the substrate, is covered with an anti-ultraviolet layer made of electrically-insulating material absorbing and/or reflecting ultra-violet rays.

10 Claims, 2 Drawing Sheets

(51) Int. Cl.
    *H01L 51/00*     (2006.01)
    *H01L 27/28*     (2006.01)

(52) U.S. Cl.
    CPC ........ *H01L 51/055* (2013.01); *H01L 51/0512* (2013.01); *H01L 51/0035* (2013.01); *H01L 2251/303* (2013.01)

(56) References Cited

U.S. PATENT DOCUMENTS

| | | | |
|---|---|---|---|
| 2011/0115101 A1 | 5/2011 | Knobloch et al. | |
| 2012/0018706 A1* | 1/2012 | Kagan | H01L 51/0558 257/40 |
| 2016/0155975 A1* | 6/2016 | Jin | H01L 51/447 257/40 |

OTHER PUBLICATIONS

Tang, et al., "Fabrication of zinc oxide/poly(styrene) grafted nanocomposite latex and its dispersion", European Polymer Journal, vol. 43, Issue 10, Oct. 2007, pp. 4210-4218.

Yang, et al., "High-performance poly(3-hexylthiophene) top-gate transistors incorporating TiO2 nanocomposite dielectrics", High-performance poly(3-hexylthiophene) top-gate transistors incorporating TiO2 nanocomposite dielectrics, vol. 11, Issue 1, Jan. 2010, pp. 81-88.

Lee, et al., "The Effect of SiO2 Shell on the Suppression of Photocatalytic Activity of TiO2 and ZnO Nanoparticles", Bulletin of the Korean Chemical Society vol. 33, Issue 11, Aug. 2012, pp. 3767-3771.

* cited by examiner

METHOD FOR PRODUCING AN ORGANIC CMOS CIRCUIT AND ORGANIC CMOS CIRCUIT PROTECTED AGAINST UV RADIATION

FIELD OF THE INVENTION

The invention relates to organic CMOS circuits, and particularly to the manufacturing thereof.

BACKGROUND OF THE INVENTION

Organic CMOS circuits generally comprise an N-type organic MOS transistor and a P-type organic MOS transistor, sharing a common gate as well as a drain and a common source. Although organic technology provides a number of advantages, for example, in terms of manufacturing cost, the semiconductor materials forming the transistors however degrade under the effect of ultraviolet rays which break their organic chains, and accordingly the electron bonds inducing the semiconductor effect. For example, an exposure to strong ultraviolet radiation largely destroys the semiconductor effect of an N-type organic semiconductor material, with ratio Ion/Ioff of the on-state current Ion to the off-state current Ioff of an N-type organic transistor falling from −6 decades to −1 decade, thereby making the transistor non-functional.

A CMOS circuit may be submitted to a first ultraviolet radiation (UV) on manufacturing thereof due to the manufacturing techniques used, and to a second type of ultraviolet radiation when it is being used, for example, solar ultraviolet rays.

Generally, to manufacture a semiconductor element on a surface of a support, a layer of semiconductor material is first deposited all over said surface, after which an etching is performed to remove the excess semiconductor material to only leave the desired semiconductor element. Now, certain etchings, particularly plasma etchings comprising bombarding the material to be removed by means of an ionized gas, generate a high quantity of ultraviolet rays and are thus not appropriate to define an organic semiconductor element.

Further, during its lifetime, a CMOS circuit is submitted to ultraviolet rays, particularly of solar origin, and with no specific measure, a degradation of the semiconductor materials forming the CMOS circuit can be observed.

SUMMARY OF THE INVENTION

An aim of the invention is to provide a CMOS circuit having a decreased sensitivity to UV radiation.

For this purpose, the invention aims at an organic CMOS circuit comprising a substrate having an N-type organic transistor and a P-type organic transistor, for example sharing a common gate as well as a common drain, formed therein, said transistors respectively comprising a layer of N-type semiconductor material and a layer of P-type semiconductor material. According to the invention, a surface of each of the semiconductor layers, opposite to the substrate, is covered with an anti-ultraviolet layer made of electrically insulating material absorbing and/or reflecting ultraviolet rays.

Another aim of the invention is to provide a method of manufacturing a CMOS circuit which protects the semiconductor materials forming the transistors against UV rays even during the manufacturing.

To achieve this, an object of the invention relates to a method of manufacturing an organic CMOS circuit comprising a substrate having an N-type organic transistor and a P-type organic transistor formed thereon, the method comprising:

forming first, second, and third separate conductive electrodes on a surface of a support;

depositing over the entire surface of the support a first layer of organic semiconductor material of a first conductivity type;

partially removing the first layer of semiconductor material to only keep a first portion of semiconductor material at least partially covering the first electrode, at least partially covering the second electrode, and covering an area of the surface of the support connecting the first and second electrodes;

depositing over the entire surface of the support a second layer of organic semiconductor material of a second conductivity type, opposite to the first conductivity type;

partially removing the second layer of semiconductor material to only keep a second portion of semiconductor material at least partially covering the second electrode, at least partially covering the third electrode, and covering an area of the surface of the support connecting the second and third electrodes.

According to the invention:

prior to the partial removal of the first layer of semiconductor material, an anti-ultraviolet layer made of an electrically insulating material absorbing and/or reflecting ultraviolet rays is deposited on the first portion of semiconductor material; and prior to the partial removal of the second layer of semiconductor material, an anti-ultraviolet layer made of an electrically insulating material absorbing and/or reflecting ultraviolet rays is deposited on the second portion of semiconductor material.

According to an embodiment, the anti-ultraviolet layers comprise an organic matrix having ZnO, $TiO_2$, $CeO_2$, and/or organoclay particles dispersed therein. Such particles strongly absorb UV rays in a wide wavelength range. Particularly, zinc oxide absorbs UV rays between 200 and 390 nanometers. Organoclays, such as for example described in application FR 2925518, block UV rays beyond 390 nanometers. The combination of ZnO, $TiO_2$, $CeO_2$ particles with organoclays thus enables to extend the UV protection range. Further, using an organic matrix having particles dispersed therein enables to control the bonding of the protection layer to the layer of semiconductor material, and thus eases the removal of protection layers, if desired.

Advantageously, the particles are coated with silica, which enables to avoid a photocatalysis of the particles subsequently or during the actual CMOS circuit manufacturing. Thus, not only does this provide time-stable particles, and thus a time-stable UV ray blocking function, but also does it avoid for products resulting from the photocatalysis to interact with the semiconductor materials and thus to degrade them.

Advantageously, the particles have their dimensions in the range from 1 nanometer to 200 nanometers, and preferably from 20 nanometers to 30 nanometers. By limiting the particle size, risks of cluster forming are thus decreased. The particles are thus homogeneously distributed in the anti-UV layers.

Advantageously, the particles amount to from 45% to 55% of the mass of the anti-ultraviolet layers, which enables to easily deposit the anti-UV layer, and thus limits the CMOS circuit manufacturing cost.

Advantageously, the anti-ultraviolet layers comprise polystyrene latex and/or pyrene carboxylic acid, which protects the particles against oxidation, and accordingly avoids for the latter to lose their anti-UV power.

According to an embodiment, the anti-ultraviolet layers have a thickness in the range from 50 nanometers to 800 nanometers, and preferably from 100 nanometers to 200 nanometers. Such thicknesses offer a good compromise between the transistor operation, having its quality depending on the thickness of the insulating layer interposed between the gate electrodes and the layers of semiconductor material, and UV protection.

According to an embodiment, each transistor comprises a layer of dielectric material interposed between the anti-ultraviolet layer covering the layer of semiconductor material of the transistor and a gate electrode of the transistor, and the total thickness of the dielectric layer and of the anti-ultraviolet layer of the transistor is smaller than 1 micrometer. It can indeed be observed that beyond a total thickness of the insulating layer, the transistors have mediocre characteristics.

According to an embodiment, the organic matrix is made of a fluorinated polymer, particularly of CYTOP.

According to an embodiment of the method, the anti-ultraviolet layers have a thickness greater than 800 nanometers, and the anti-ultraviolet layers are removed after the completion of the first and second portions of semiconductor material. A significant thickness indeed enables to optimize UV protection during the CMOS circuit manufacturing.

According to an embodiment of the method, the partial removals of the layers of semiconductor material are performed by means of a plasma etching, such a technique being now appropriate for the manufacturing of an organic CMOS circuit.

According to an embodiment, the anti-ultraviolet layer substantially only covers the semiconductor layer. According to an embodiment, the transistors comprise gate electrodes transparent to visible radiation. The total surface area of the circuit which is transparent to light, while obtaining an efficient protection of the semiconductor layers against UV rays, is thus maximized.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION OF THE INVENTION

As known per se, a CMOS circuit comprises a P-type organic transistor and an N-type organic transistor sharing a common gate, the source of a transistor further being the drain of the other transistor, or the transistors sharing a common drain. In the following, a "high gate"-type transistor topology is described. Of course, the invention applies to any type of topology, particularly to a "low gate"-type topology. Similarly, electrodes common to the two transistors are described, such electrodes for example being formed of a single element which fulfils two functions. It should be understood that the invention also applies to any type of electrode and of connection diagram thereof.

A method of manufacturing an organic CMOS circuit according to a first embodiment will now be described in relation with FIGS. 1 to 11.

The method starts (FIG. 1) with the forming of an organic or inorganic substrate 10 having a thickness in the range from 25 micrometers to 1 millimeter, made of silica, or silicon, of polyethylene terephthalate (PET), of polyethylene naphthalate (PEN), of polyimide (PI), of polyether imide (PEI), of polyether sulfone (PES), of polysulfone (PSF), of polyphenylene sulphide (PPS), of polyether ether ketone (PEEK), of polyacrylate (PA), of polyamide imide (PAI), of polystyrene, of polyethylene, of polypropylene, of a polyamine resin, of a carbonate resin, or of a cellulose resin. For example, the substrate is made of PET or of PEN having a thickness in the range from 100 micrometers to 150 micrometers, particularly 125 micrometers, which enables to define a flexible substrate having a good temperature behavior and a good mechanical behavior.

Figure 1:
FIGS. 1 to 11 are simplified cross-section views illustrating a method according to a first embodiment of the invention.
Figure 2:
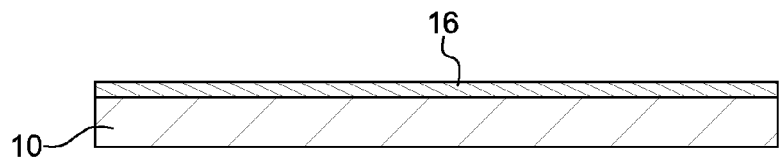
Figure 3:
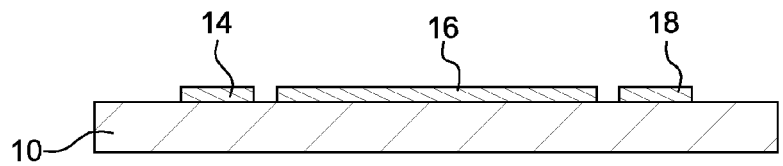

The method carries on (FIG. 2) by the deposition of a layer of conductive material 12 over a thickness in the range from 20 nanometers to 100 nanometers, preferably 30 nanometers, followed by an etching, for example, chemical, implemented to define a first, a second, and a third electrodes 14, 16, 18 defining the drain and source electrodes of two organic transistors (FIG. 3). The material forming electrodes 14, 16, 18 is a metal, for example, gold (Au), silver (Ag), copper (Cu), nickel (Ni), palladium (Pd), platinum (Pt), aluminum (Al), titanium (Ti), chromium (Cr), molybdenum (Mo), a conductive polymer, for example, poly(3,4-ethylenedioxythiophene) (PEDOT) mixed with poly(styrene sodium sulfonate) (PSS), polyaniline (Pani), or a conductive metal oxide, for example, indium-tin oxide (ITO), aluminum zinc oxide (AZO), tungsten trioxide ($WO_3$).

Optionally, when the electrodes are made of metal, a material modifying their work function is further deposited thereon to improve the charge injection into the semiconductor materials with which they will subsequently be in contact to form transistors.

Further, first electrode 14 and a portion of second electrode 16, having an N-type semiconductor element constitutive of the N-type transistor subsequently deposited thereon, are covered with a layer of a few nanometers of SAM (self-assembled monolayer), particularly of 4-(methylsulfanyl)-thiophenol (MeSTP), of 4-methoxythiophenol (MeOTP), of 4-methylthiophenol (MeTP), of 4-aminothiophenol (ATP), of 4-nitrothiophenol (NOTP), of cysteamine (CT), of 1-decanethiol (DT), of 1H,1H,2H,2H-perfluorodecanethiol (PFDT), or of 1H,1H,2H,2H-perfluorooctanethiol (PFOT).

Similarly, third electrode 18 and a portion of second electrode 14 having a P-type doped semiconductor element constitutive of a P-type MOS transistor subsequently deposited thereon, are covered with a layer of a few nanometers of SAM, particularly of perfluorobenzenethiol (PFBT).

Advantageously, before the deposition of the SAM layers, substrate 10 and electrodes 14, 16, 18, undergo a cleaning which improves the grafting of SAMs on the electrodes and the bonding of the substrate to the subsequently-deposited semiconductor materials. For example, the cleaning is performed by means of a plasma.

Figure 4:
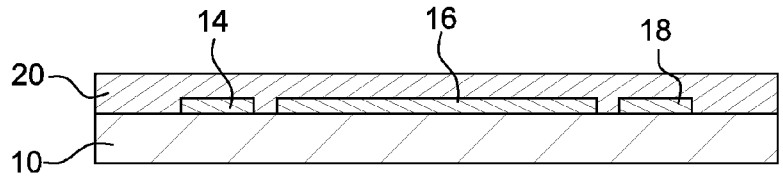

In a next step, a layer of N-type organic semiconductor material 20 is deposited over the entirety of support 10 and of electrodes 14, 16, 18 (FIG. 4). The thickness of the layer of semiconductor material is preferably in the range from 70 nanometers to 120 nanometers so as to decrease, or even to avoid, parasitic resistances in the organic transistors.

Figure 5:
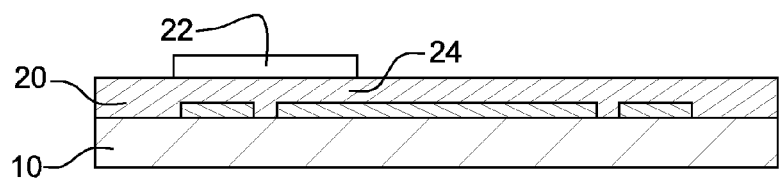

The method then carries on with the deposition of a first anti-UV mask 22 on the layer of N-type organic semiconductor material 22, the geometry of the mask corresponding to that of the semiconductor element comprised in the N-type organic transistor (FIG. 5). Anti-UV mask 22 is made of an electrically-insulating organic material further having an anti-UV radiation reflective or absorbing power, which protects against UV rays the portion of semiconductor material 24 on which it is deposited, as will be explained in further detail hereafter.

Figure 6:
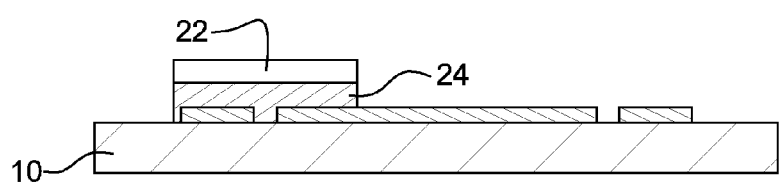

An etching is then applied to remove N-type semiconductor material layer 20, except for portion 24 having anti-UV mask 22 deposited thereon (FIG. 6). The presence thereof enables to use etchings associated with a UV ray emission, including a high UV emission. Particularly, a plasma etching is implemented, this technique having the advantage of being a dry etching only applied to the targeted surface and enabling to orthogonally etch layer 20. Other etchings are however possible, for example, a chemical etching.

Figure 7:
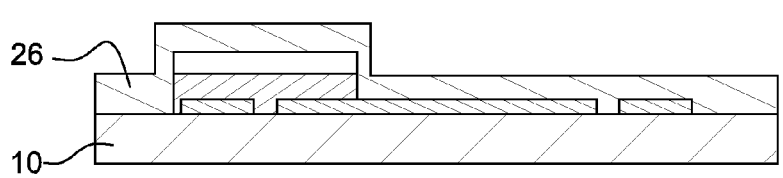

In a next step, a layer of P-type doped semiconductor material 26 is deposited all over the assembly obtained at the previous step (FIG. 7). Layer 26 has a thickness between 70 nanometers and 120 nanometers to limit parasitic resistances.

Figure 8:
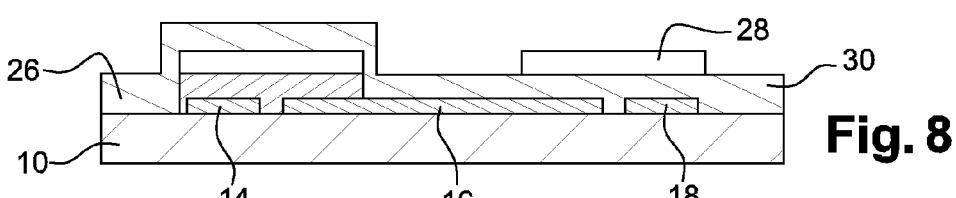

A second anti-UV mask 28 is then deposited on the layer of organic P-type semiconductor material 26, the geometry of the second mask 28 corresponding to that of the semiconductor element constitutive of the P-type organic transistor (FIG. 8). Second anti-UV mask 26 is made of an electrically-insulating organic material further having an anti-UV radiation reflective or absorbing power which protects against UV rays the portion of semiconductor material 26 on which it is deposited, as will be explained in further detail hereafter.

Figure 9:
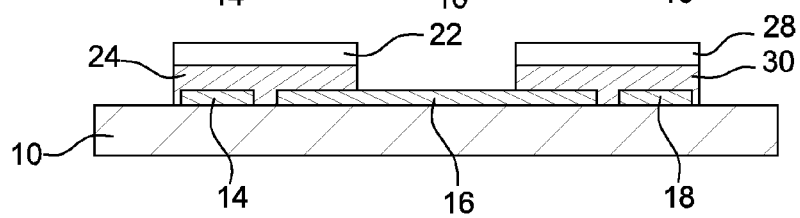

An etching is then applied to remove the layer of P-type semiconductor material 26, except for portion 30 having anti-UV mask 22 deposited thereon (FIG. 9). Due to the presence thereof, it is also possible to use etchings associated with a UV ray emission, including a high UV emission. Particularly, a plasma etching is implemented. Other etchings are however possible, for example, a chemical etching.

Figure 10:
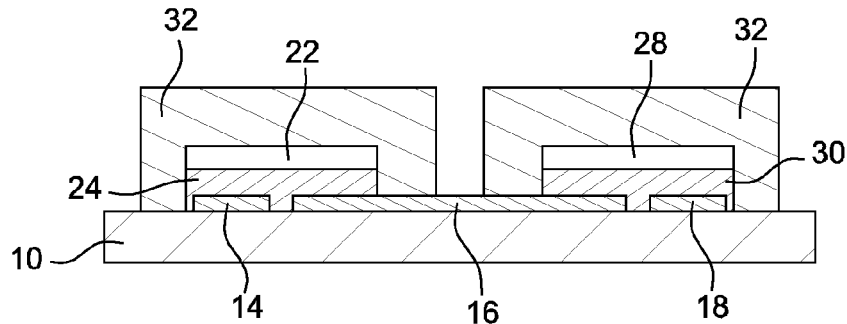

In a next step, an organic dielectric layer 32 is formed to electrically insulate semiconductor material portions 24, 30 and to leave a portion of the second electrode 16 exposed (FIG. 10). For example, the dielectric layer is deposited on support 10, electrodes 14, 16, 18 and the islands formed of semiconductor material portions 24, 30 and of anti-UV masks 22, 28, after which a portion of dielectric layer 32 is etched to expose a portion of second electrode 16. Dielectric layer 32 is for example made of a fluorinated polymer, particularly of CYTOP, of polyvinylphenol (PVP), of polymethyl methacrylate (PMMA) combined or not with acrylate, polystyrene, or polyimide, and has a thickness in the range from 500 nanometers to 1 micrometer.

Finally, the method ends with the deposition of a first and of a second conductive gate electrodes 34, 36 on dielectric layer 32, respectively above the first and second electrodes 14, 16 and above the second and third electrodes 16, 18, by a thickness in the range from 30 nanometers to 1 micrometer, and preferably from 50 nanometers to 200 nanometers, as well as a conductive area 38 of contact with second electrode 38. Electrodes 34, 38 and contacting areas 38 are for example made of a material described in relation with electrodes 14, 16, 18, for example, a material identical to that of electrodes 14, 16, 18.

A CMOS circuit comprising an organic N-type transistor, comprising or formed of the first and the second electrodes 14, 16 respectively forming the drain and the source of the transistor, of N-type semiconductor portion 24, of dielectric layer 32, and of gate 34, and an organic P-type transistor, comprising or formed of the second and the third electrodes 16, 18, respectively forming the source and the drain of the transistor, of P-type semiconductor portion 30, of dielectric layer 32, and of gate 36, has thus been obtained.

The organic semiconductor layers constitutive of the N and P transistors have thus been protected from UV rays during the circuit manufacturing and are protected during the circuit use by anti-UV masks 22, 28.

The embodiment which has just been described further has the following advantages:
- the presence of anti-UV masks 22, 28 in the CMOS circuit further enables to do away with an upper anti-UV encapsulation layer.
- the possibility of using a dielectric layer and/or transparent gates, since an anti-UV protection is implemented by the masks. For example, the gates may have a low thickness letting through a significant quantity of visible radiation, and incidentally also a significant quantity of UV rays. Thus, for certain applications, the thickness and/or the choice of the gate materials are selected so that the latter are transparent;
- each anti-UV mask 22 and 28 is only located on the corresponding semiconductor portion 24, 30. A protection of semiconductor portions 24, 30 is thus obtained while letting light through at the level of the areas of the CMOS circuit where there is no anti-UV protection. The surface area occupied by anti-UV masks is thus decreased to its minimum. The CMOS circuit may thus for example be used in applications requiring a transparency of the circuit, such as for example in an active matrix of a display;
- anti-UV masks 22, 28 are directly formed in contact with semiconductor layers 22 and 28, the CMOS circuit layers thus being stack in the "semiconductor layers/anti-UV masks/dielectric layer" order. It has indeed been observed that forming a stack having the "semiconductor layers/dielectric layer/anti-UV masks" order may result in a significant leakage current when the anti-UV masks are formed of a matrix having anti-UV particles dispersed therein. Indeed, the particles may form particle clusters having points which pierce the underlying dielectric layer on deposition of the anti-UV masks, thus resulting in a poor electric insulation between the gate and the semiconductor layers, and thus in a strong leakage current, or even in a short-circuit;
- the anti-UV masks also form the masks for the etching, which thus limits the number of CMOS circuit manufacturing steps.

Figure 13:
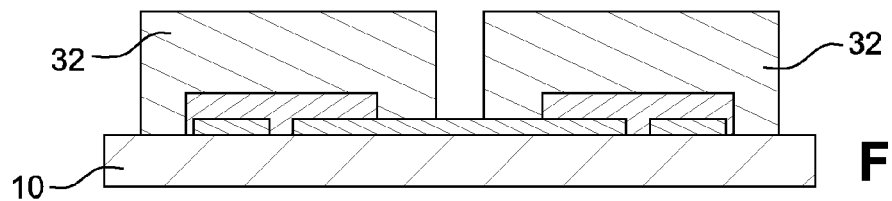
Figure 14:
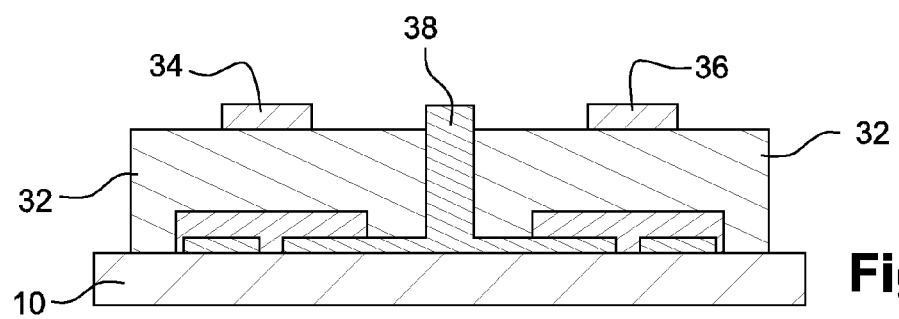

A method according to a second embodiment will now be described in relation with FIGS. 12 to 14.

The first steps of the method according to the second embodiment are identical or similar to the first steps of the first embodiment described in relation with FIGS. 1 to 9, the thickness and the structure of anti-UV masks 22 and 28 being however likely to vary as described hereafter. The second mode thus has the advantages described hereabove in relation with the etching and the anti-UV protection during said etching.

Figure 12:
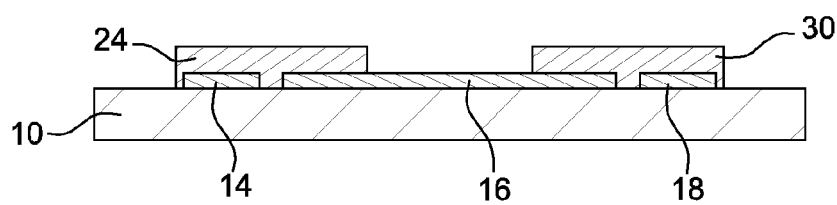
FIGS. 12 to 14 are simplified cross-section views illustrating a method according to a second embodiment of the invention.

The method carries on with the removal of masks 22 and 28 (FIG. 12). Such a removal is performed by liquid etching with a solvent orthogonal to the active layers of the CMOS, that is, a solvent which is not capable of etching or dissolving them, such as cyclohexane or all fluorosolvents or by other techniques such as laser etching or plasma etching. Particularly, the selection of the material(s) for the above-described masks enables to easily remove these masks, while leaving substantially no residue on the semiconductor layers, the final quality of the circuit being thus substantially unaffected by the presence of a residue.

Figure 11:
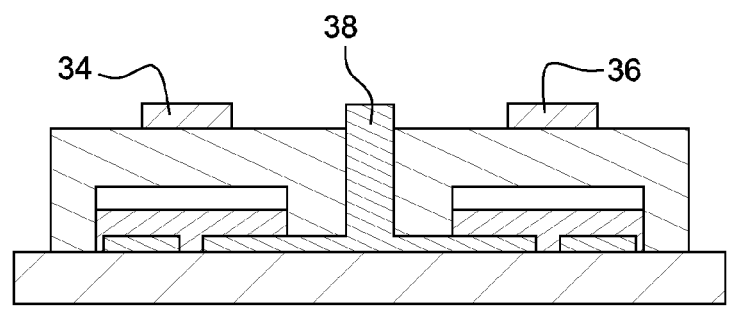

Dielectric layer 32 is then deposited (FIG. 13) similarly to the step described in relation with FIG. 10, after which gates 34, 36 and contacting area 38 are formed similarly to the step described in relation with FIG. 11.

The semiconductor material of portions 24, 30 is formed of molecules of small molecular mass, currently called "small molecules", and particularly of molecules having a molecular mass smaller than 1,000 g/mol, or of polymers formed of macromolecules of larger molecular mass. These two types of organic semiconductors have the common point of having a conjugated system resulting from the alternation of simple and double carbon-carbon bonds, and thus of having a semiconductor effect.

As an example of organic semiconductor materials of small molecular mass, materials of polyacene, oligo-thiophene, or phtalocyanine type may be mentioned.

As an example of polymer organic semiconductor materials, materials of polyacetylene, polyphenylene, polythiophene, or poly(phenylene/vinylene) type may be mentioned.

It may in particular be an organic semiconductor selected from the group comprising pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylene-vinylene and its derivatives, polyparaphenylene and its derivatives, polyfluorene and its derivatives, copolymer, polyfluorene-oligothiophene and its derivatives, polythiophene-vinylene and its derivatives, a heterocyclic aromatic copolymer of polythiophene and its derivatives, oligonaphthalene and its derivatives, alpha-5-thiophene oligothiophene and its derivatives, phthalocyanine that contains no metal and its derivatives, pyromellitic dianhydride and its derivatives, pyromellitic diimide and its derivatives, perylene tetracarboxylic acid dianhydride and its derivatives, perylene tetracarboxylic diimide and its derivatives, naphthalene tetracarboxylic diimide and its derivatives, or naphthalene dianhydride-tetracarboxylic acid and its derivatives.

Advantageously, the P-type organic semiconductor material is selected from among pentacene, tetracene, and anthracene, modified TIPS pentacene, polythiophene, P3HT (poly (3-hexylthiophene)), PCDTBT (poly [N-9'-heptadecanyl-2, 7-carbazole-alt-5,5-(4,7-di-2-thienyl-2',1',3'-benzothiadiazole]), and is preferably pentacene.

Advantageously, the N-type organic semiconductor material is selected from among perylene diimide, fullerene, PCBM ([6,6]-phenyl-$C_{61}$-methyl butyrate), PCNEPV (poly [oxa-1,4-phenylene-(1-cyano-1,2-vinylene)-(2-methoxy-5-(3,7-dimethyl-octyloxy)-1,4-phenylene)-1,2-(2-cyanovinylene)-1,4-phenylene]), and polyfluorene.

Anti-UV masks 22, 30 are made of a composition comprising an organic matrix, in particular polymer, having particles which block UV radiation by absorption or reflection dispersed therein or deposited thereon. The matrix having the particles dispersed therein is for example deposited by a "sol-gel" technique, a vacuum deposition technique, a cathode sputtering technique, a spin coating technique, a knife coating technique, or the like.

The organic matrix is advantageously made of a polymer which has no affinity with the semiconductor materials constitutive of the transistors and which accordingly does not deteriorate the latter. Further, in the context of the embodiment where masks 22, 30 are removed, the matrix is also selected to be easily removable by etching without inducing the etching of semiconductor portions 24, 30 on which they are deposited. To achieve this, the matrix of anti-UV masks 22, 30 is made of a fluorinated polymer, particularly CYTOP, which has no affinity with usual organic semiconductor materials, and which may be etched by a so-called "orthogonal" solvent, such as butyl acetate, ethyl acetate, or methyl acetate, which does not deteriorate organic semiconductor materials either.

Other polymers are also possible, such as for example, vinyl polymers, particularly polystyrene, which may be etched by a solvent such as ethyl acetate.

The particles blocking UV rays are ZnO, $TiO_2$, and/or $CeO_2$ particles. As a variation, or additionally, organic anti-UV pigments such as described in application FR 2955115 are dispersed in the organic matrix.

Advantageously, organoclay particles are also dispersed in or deposited on the matrix, to extend the range of blocked UV rays. Organoclays indeed comprise pyrene and/or phenylhydroxybenzotriazole, which block UV rays up to a 400-nanometer wavelength. Organoclays have the advantage of minimizing electric defects, especially traps.

Organoclays are for example described in application FR 2925518. A combination of ZnO particles and of organoclay particles thus enables to block UV rays in the 200-400 nanometer range. Organoclays are for example manufactured by following the operating mode described in application FR 2925359, the size of the obtained organoclay elements being of approximately 30 nanometers. These elements are flat, have an organic surface, and are dispersible up to 30% by mass in water or in organic solvents, such as an alcohol, a ketone, a chlorinated solvent, or a fluorinated solvent, such as for example perfluoro alkane/decane hexane, or perfluoro isobutene. The solution comprising the organoclays thus obtained is then filled with the organic anti-UV particles, for example, according to the operating mode described in application FR 2925359, after which a binder, for example acrylate, is added. The obtained composition is then for example spin coated or knife coated.

Advantageously, the composition also comprises a material which blocks visible wavelengths, for example, a dye, particularly to protect the semiconductor materials during strong emissions in the visible range due to certain etch techniques used, particularly plasma etching.

Advantageously, inorganic particles, for example, ZnO and/or pyrene particles, are added to the composition to shift the UV absorption spectrum.

Advantageously, a polystyrene, a pyrene, or a derivative thereof, for example polystyrene latex and/or pyrene carboxylic acid, is added to the matrix, to inhibit a photocatalytic surface effect of the dispersed particles. Indeed, anti-UV organic particles are usually highly sensitive to oxidation with oxygen and ozone. Further, oxide particles may, under the effect of a photocatalysis, generate free radicals capable of reacting with the organic semiconductor materials and thus of degrading the latter. Thus, if the etching of the semiconductor material layers is postponed, with no specific measure, there is a risk of seeing the particles oxidize. Similarly, the use of a plasma, particularly during a plasma etching, frequently generates ozone, which may also degrade said particles. A derivative of pyrene or of polystyrene thus enables to prevent such a phenomenon. For example, a derivative of pyrene according to the following formulation, with n=1 to 4, may be used:

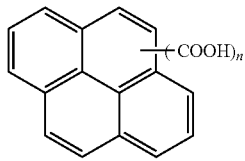

Advantageously, the particles dispersed in the matrix are coated with a silicon shell, which also enables to avoid a photocatalysis thereof. The silicon shell also enables to easily formulate the particles via the silane coupling agent chemistry. By encapsulating the particles, their stability in the mixture is increased and their integration is improved.

Advantageously, the particles have their dimensions ranging from 1 nanometer to 200 nanometers, and preferably from 20 nanometers to 30 nanometers, and amount to from 35% to 55% of the mass of the anti-ultraviolet layer, which allows an easy deposition of the anti-UV layer. Limiting the particle size thus decreases the risk for clusters to form and thus the risk of areas containing no anti-UV particles, which would not protect the semiconductor materials. Further, by selecting such a mass percentage, the composition formed of the matrix and of the dispersed particles easily deposits in the form of a film and may further be easily removed.

As a variation, a colloidal dispersion of ZnO is for example used, where ZnO amounts to 35% by mass and is dispersed in an organic solvent, for example, alcohol or ketone, where such as colloidal sol may be formulated with an organic binder, such as acrylate, for example, and deposited by spin or knife coating on the layer to be protected. Advantageously, ZnO nanoparticles in the form of disks having a diameter of at least 30 nanometers and a 20-nanometer thickness, such as those commercialized by EVONIK and BYK, are used. Disks have the advantage of self-arranging on the substrate to form continuous layers.

The composition and/or the thickness of the anti-UV masks are advantageously selected according to the anti-UV protection type desired for the CMOS circuit.

Particularly, when the CMOS circuit comprises in its final form anti-UV masks 22 and 30, the thickness thereof is selected to disturb as little as possible the transistor operation. Particularly, masks 22, 30 and dielectric layer 32 form together an insulating layer having the function of insulating the gate electrodes from the layers of semiconductor material. Preferably, the total thickness of insulating material between a gate electrode and the associated semiconductor material is smaller than 1 micrometer. Above this, a substantial degradation of the transistor performances can be observed.

The mask thickness is further selected according to the quantity of UV rays capable of impacting anti-UV masks. Particularly, when a plasma etching is used for the manufacturing of transistors, the thickness of the masks is selected according to the power of the plasma. Advantageously, a fluorinated polymer layer having between 45% and 55% by mass of the ZnO particles dispersed therein, with a thickness in the range from 50 to 200 nanometers, enables to efficiently protect the UV radiation generated by plasma having a power lower than 10 watts. Similarly, a thickness greater than 200 nanometers enables to efficiently protect against a plasma power in the range from 10 watts to 50 watts, and a thickness greater than one micrometer enables to protect the semiconductor materials against plasma powers greater than 50 watts.

When the anti-UV masks are removed, and are thus not part of the final CMOS circuit, the user has more degrees of liberty for the selection of the composition and of the thickness of said filters. The filter may thus have a thickness greater than 800 nanometers, or even greater than one micrometer, to guarantee a substantially total protection against UV rays generated by significant plasma powers.

Of course, other types of etching may be used, for example, chemical etchings, to remove the excess semiconductor materials. When anti-UV masks aim at providing a protection against UV rays only, a thickness in the range from 100 nanometers to 200 nanometers provides an efficient protection.

The invention claimed is:

1. An organic CMOS circuit comprising a substrate having an N-type organic transistor and a P-type organic transistor formed therein, said transistors respectively comprising a layer of N-type semiconductor material and a layer of P-type semiconductor material, wherein a surface of each of the semiconductor layers, opposite to the substrate, is covered with an anti-ultraviolet layer made of electrically-insulating material absorbing and/or reflecting ultraviolet rays, the anti-ultraviolet layer being in direct contact with the semiconductor layer.

2. The organic CMOS circuit of claim 1, wherein the anti-ultraviolet layers comprise an organic matrix having ZnO, $TiO_2$, $CeO_2$, and/or organoclay particles dispersed therein.

3. The organic CMOS circuit of claim 2, wherein the particles are coated with silica.

4. The organic CMOS circuit of claim 2, wherein the particles have their dimensions in the range from 1 nanometer to 200 nanometers.

5. The organic CMOS circuit of claim 2, wherein the particles amount to from 45% to 55% of the mass of the anti-ultraviolet layer.

6. The organic CMOS circuit of claim 1, wherein the anti-ultraviolet layers comprise polystyrene latex and/or pyrene carboxylic acid.

7. The organic CMOS circuit of claim 1, wherein the anti-ultraviolet layers have a thickness in the range from 50 nanometers to 800 nanometers.

8. The organic CMOS circuit of claim 1, wherein each transistor comprises a layer of dielectric material interposed between the anti-ultraviolet layer covering the layer of semiconductor material of the transistor and a gate electrode of the transistor, and wherein the total thickness of the dielectric layer and of the anti-ultraviolet layer of the transistor is smaller than 1 micrometer.

9. The organic CMOS circuit of claim 1, wherein the anti-ultraviolet layer only substantially covers the semiconductor layer.

10. The organic CMOS circuit of claim 1, wherein the transistors comprise gate electrodes transparent to the visible radiation.

* * * * *